(12) United States Patent
Krebs et al.

(10) Patent No.: US 8,988,752 B2
(45) Date of Patent: Mar. 24, 2015

(54) BEAM CONTROL APPARATUS FOR AN ILLUMINATION BEAM AND METROLOGY SYSTEM COMPRISING AN OPTICAL SYSTEM CONTAINING SUCH A BEAM CONTROL APPARATUS

(71) Applicant: Carl Zeiss SMT GmbH, Oberkochen (DE)

(72) Inventors: Marten Krebs, Auernheim (DE); Gerhard Huber, Tutzing (DE); Uwe Schellhorn, Aalen (DE); Joachim Stuehler, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 13/676,473

(22) Filed: Nov. 14, 2012

(65) Prior Publication Data
US 2013/0120820 A1 May 16, 2013

(30) Foreign Application Priority Data
Nov. 14, 2011 (DE) .......................... 10 2011 086 240

(51) Int. Cl.
G02B 26/08 (2006.01)
G03F 1/84 (2012.01)
G03F 7/20 (2006.01)
G03F 1/24 (2012.01)

(52) U.S. Cl.
CPC .............. G02B 26/0816 (2013.01); G03F 1/84 (2013.01); G03F 7/7065 (2013.01); G03F 1/24 (2013.01)
USPC ................... 359/225.1; 359/198.1; 359/201.1; 359/201.2; 359/226.1

(58) Field of Classification Search
CPC ........... G02B 26/0816; G02B 26/0833; G02B 26/0841; G02B 26/085; G02B 26/0858; G02B 26/0866; G02B 26/10; G02B 26/101; G02B 26/105; G02B 26/126
USPC ..................................... 359/863, 225.1, 201.2
See application file for complete search history.

(56) References Cited

U.S. PATENT DOCUMENTS 6,359,678 B1 * 3/2002 Ota .................................. 355/53
6,882,477 B1 * 4/2005 Schattenburg et al. ....... 359/577

(Continued)

FOREIGN PATENT DOCUMENTS

DE 10220815 A1 11/2003 ............... G21K 7/00

OTHER PUBLICATIONS

German Examination Report, German Application No. 10 2011 086 240.4, 5 pages, Sep. 10, 2012.

Primary Examiner — Suchin Parihar
Assistant Examiner — William R Alexander
(74) Attorney, Agent, or Firm — Fish & Richardson P.C.

(57) ABSTRACT

A beam control apparatus for an illumination beam includes an imaging illumination optical unit assembly for imaging an intermediate focus of the illumination beam onto an object field to be illuminated. A control component that influences a beam path of the illumination beam is displaceable in at least one degree of freedom by at least one displacement actuator. A position sensor device of the beam control apparatus detects a position of the intermediate focus. A control device of the beam control apparatus is signal-connected to the position sensor device and the displacement actuator. From an intermediate focus position signal received from the position sensor device, the control device calculates control signals for the displacement actuator and forwards the latter to the displacement actuator for controlling the position of the intermediate focus. This results in a beam control apparatus which makes well-controllable illumination possible together with a simple construction.

23 Claims, 3 Drawing Sheets

(56) References Cited

U.S. PATENT DOCUMENTS

| | | | |
|---|---|---|---|
| 7,821,714 B1 * | 10/2010 | Lee et al. | 359/565 |
| 2008/0017810 A1 * | 1/2008 | Frijns | 250/492.2 |
| 2010/0321808 A1 * | 12/2010 | Bentley et al. | 359/859 |
| 2011/0016437 A1 | 1/2011 | Scherübl et al. | 716/52 |

* cited by examiner

BEAM CONTROL APPARATUS FOR AN ILLUMINATION BEAM AND METROLOGY SYSTEM COMPRISING AN OPTICAL SYSTEM CONTAINING SUCH A BEAM CONTROL APPARATUS

CROSS-REFERENCE TO RELATED APPLICATIONS

This application claims priority to German patent application DE 10 2011 086 240.4, filed Nov. 14, 2011, the content of which is incorporated by reference in its entirety.

BACKGROUND

The invention relates to a beam control apparatus for an illumination beam.

Furthermore, the invention relates to an optical system comprising a beam control apparatus of this type, and to a metrology system comprising an optical system of this type.

US 2008/0 017 810 A1 discloses an EUV light source wherein a beam impingement position of a laser representing part of the light source is readjusted.

SUMMARY

In one aspect, the present invention provides a beam control apparatus that allows well-controllable illumination possible together with a simple construction.

In the simplest case, the beam control apparatus according to the invention manages with a single control component and is then constructed comparatively simply. The illumination beam can be tracked in a controlled manner by the control device. An actual value, e.g., of the position or the pointing direction of the illumination beam in that manner can be set to a given value. The beam control apparatus can comprise a collector and focusing optical unit for acquiring an illumination emission of the light source and for concentrating the acquired illumination beam into the aerial image. The aerial image of the illumination beam is an image of the light source, that is to say generally a focus of the illumination beam. The aerial image can be situated at the location of an intermediate focus of a beam path of the illumination beam. An imaging illumination optical unit assembly that can additionally be provided ensures that control of the position of the illumination beam impinging on an object field is possible by means of control of the position of an aerial image present at the location of an intermediate focus. The term object field denotes the illuminated field in an object plane which is intended to be imageable by an imaging optical unit or by the imaging illumination optical unit assembly. It suffices to detect the position of the aerial image by detecting a positional deviation of the aerial image transversely with respect to a predefined beam direction. A positional detection also of a position of the aerial image along said beam direction, that is to say a detection of the position of a focal plane, is additionally possible, and not mandatory. The beam control apparatus can comprise an imaging illumination optical unit assembly for imaging the aerial image of the illumination beam onto an object field to be illuminated. This is also designated as critical illumination of the object field. By means of the displacement actuator, the control component can be displaced in at least one degree of freedom of translation and/or of rotation. The beam path of the illumination beam is directly influenced by the control component. The control component can be a component which is mechanically directly connected to a beam section or to at least one surface that guides the illumination beam path. A control component of this type can be a control mirror or else, for example, a source unit of the radiation source, the position of which relative to downstream guide components for the illumination beam path can be controlled.

A control mirror can be provided to make a well-controllable beam direction predefinition possible. It has been found that such a beam direction predefinition can in many cases meet the requirements made of the beam control apparatus. The tilting axes about which the control mirror is tiltable by the tilting actuators can span a plane that runs parallel to a main body plane of a main body of the control mirror. These two tilting axes can be perpendicular to one another. In the case of a control mirror having a planar reflection surface, said main body plane is parallel to the plane in which the reflection surface lies. Preferably, the tilting axes lie in the plane in which the reflection surface is arranged or in a plane that touches the reflection plane. The control mirror can also be displaceable by more than two displacement actuators, which can all be drivable independently of one another. Instead of a control mirror, some other optical elements can also be used as control component, for example a diffractive element, e.g., a zone plate, a beam splitter, in particular also a polarizing beam splitter, or an acousto-optical modulator, in particular a diffractive element having a variable or controllable deflection angle for the illumination beam passing through. The control mirror can reflect the illumination beam.

A control mirror embodied in curved fashion, that is to say a control mirror whose reflection surface is not embodied in planar fashion, can additionally be used for the beam shaping of the illumination beam. The control mirror can be embodied as an ellipsoidal mirror. The reflection surface of the control mirror can have different curvatures in mutually perpendicular sectional planes. This can be used for astigmatically influencing the illumination beam.

A control mirror that is displaceable for the control can extend the control possibilities of the beam control apparatus. A driven displacement is possible along the at least one degree of freedom of translation. Such a displacement can be effected along two or else three independent degrees of freedom of translation. The displacement can in turn be effected by a plurality of displacement actuators that are preferably drivable independently of one another.

A displaceable support frame is a further variant for the control component of the beam control apparatus. These variants "control mirror" and "displaceable support frame" can also be part of the beam control apparatus in combination with one another.

A coupling-out unit of the position sensor device can use coupled-out radiation that is not used for the illumination.

A position sensor device is sensitive. The position sensor device can comprise one, two three, four or else even more coupling-out mirrors and position sensors respectively assigned thereto. Instead of a coupling-out mirror, it is also possible to use some other optical element as coupling-out unit, for example a diffractive element, e.g., a zone plate, a beam splitter, in particular also a polarizing beam splitter, or an acousto-optical modulator, in particular a diffractive element having a variable or controllable deflection angle for the illumination beam passing through. The coupling-out unit, in particular at least one coupling-out mirror, can be realized by a structuring of the control component which influences the beam path of the illumination beam, for example by structuring of the control mirror. At the structures, a part of the illumination beam is coupled out and used for beam control.

A stop or diaphragm can be arranged between the aerial image, which then lies at the location of an intermediate focus, and the object field and can be arranged in particular between the aerial image and the first mirror of the imaging illumination optical unit assembly. The choice of a subaperture of the illumination beam, said subaperture illuminating the object field, can be effected by means of the diaphragm. This can be used for predefining an illumination angle distribution for illuminating the object field with the illumination beam.

An embodiment of the control device can enable the object field illumination to be homogenized temporally and/or locally. The desired position can be predefined in the form of a spiral path in an aerial image plane with a sequentially increasing and decreasing radius. The desired position can also be predefined in the form of a spiral path with constant angular frequency and modulated radius. A modulation can be effected such that a square of the radius of the spiral path is directly proportional to the elapsed time. In an alternative embodiment of the beam control apparatus, the aerial image can be displaced in its position by a device that is independent of the control device. A beam stabilization by means of the control device and an aerial image displacement, which can be produced by wobble of the aerial image, for example, can be realized by different components of the beam control apparatus.

The advantages of an optical system and a metrology system described in this disclosure correspond to those which have already been explained above with reference to the beam control apparatus according to the invention. The optical system can additionally comprise a pupil forming component, which predefines an illumination angle distribution for illuminating the object field. Said pupil forming component, which can be realized as a diaphragm component, can operate independently of the beam control apparatus. In the metrology system, varying pupil illuminations, for example as a result of a light source emission characteristic that varies with time, can be compensated for by corresponding driving of the light source, for example by a displacement of the light source, in particular by a rotation of the light source. In a pupil plane of the illumination optical unit, it is possible to provide sensors for the illumination beam or for coupled-out portions from the latter. Such sensors can be arranged for example at the edge of a pupil of the illumination optical unit. These pupil sensors can detect a centroid displacement of an illumination of the pupil plane with the illumination beam and track the light source by corresponding driving in terms of its operating point and/or in terms of its position and/or in terms of its orientation by rotation such that the centroid of the pupil illumination is held at a desired position.

DESCRIPTION OF DRAWINGS

Exemplary embodiments of the invention are explained in greater detail below with reference to the drawings, in which.

DETAILED DESCRIPTION

Figure 1:
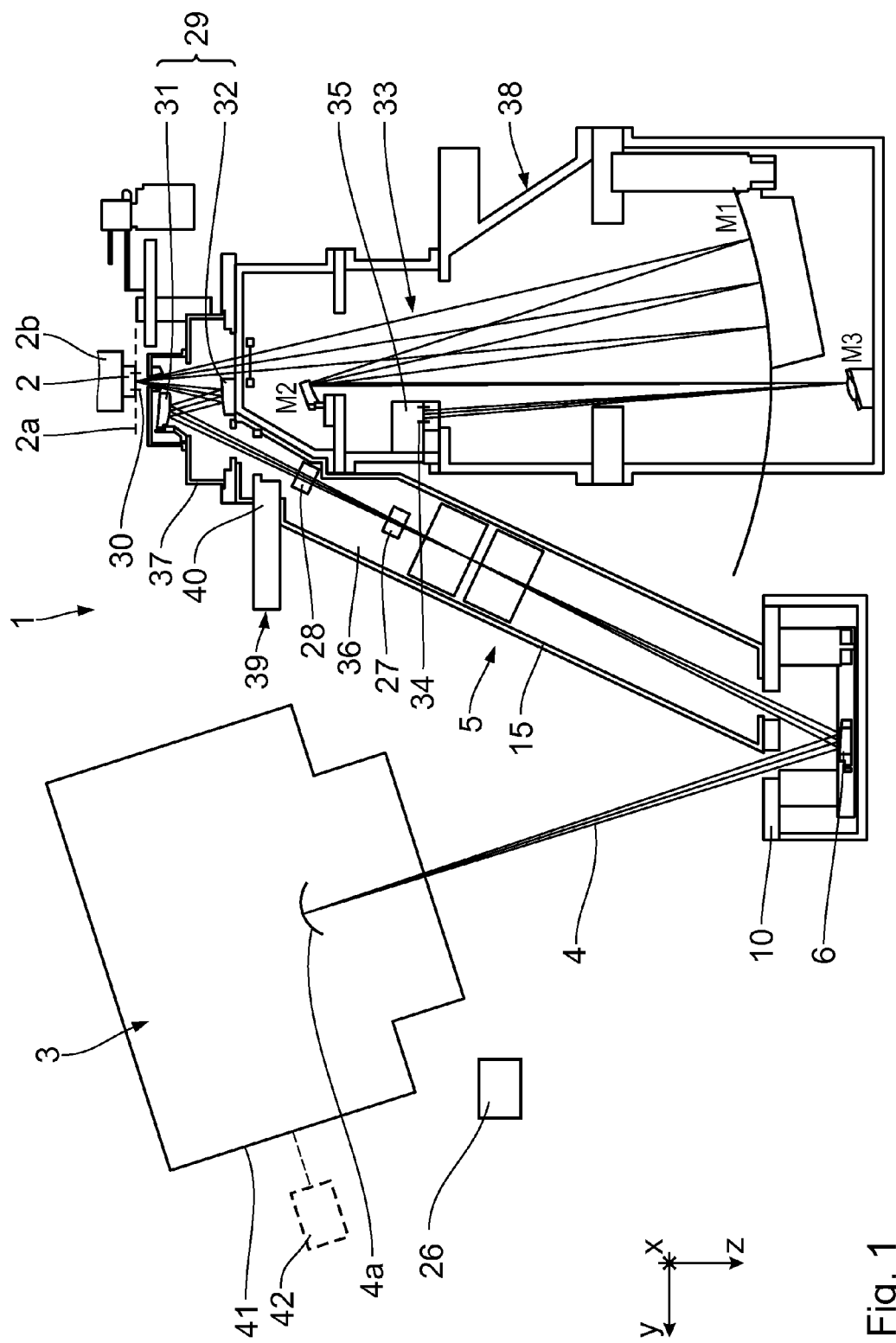
FIG. 1 schematically shows a metrology system for examining objects with an EUV light source system, containing a light source and a beam control apparatus for an illumination beam.

A metrology system 1 illustrated schematically in FIG. 1 serves for analyzing an object 2, for example a lithography mask, for patterning faults. The object 2 is arranged in an object plane 2a of the metrology system 1. The lithography mask can be used in EUV projection lithography in the context of producing patterned semiconductor components, for example memory chips. The object 2 is supported by an object holder 2b illustrated schematically.

A patterning fault of the object 2 that is to be examined can be examined with the aid of an analysis of a so-called aerial image (Aerial Image Measurement System, AIMS). The metrology system 1 serves for simulating and analyzing the effects of, for example, the properties of lithography masks on an optical imaging of projection optical units within a projection exposure apparatus. An AIMS system is known from DE 102 20 815 A1.

The metrology system 1 is accommodated in an evacuated system chamber (not illustrated in more specific detail). A residual atmosphere in the system chamber can be predefined in a targeted manner, e.g., a low partial pressure in the range of, for example, a few $10^{-2}$ mbar $H_2$.

An EUV light source 3 serves for illuminating the object 2, said light source generating illumination emission in the form of an EUV illumination beam 4. The light source 3 can generate EUV using radiation in a wavelength range of between 2 nm and 30 nm, for example, in the range of between 2.3 nm and 4.4 nm, or in the range of between 5 nm and 30 nm. For the light source 3, the light sources which are also customary for EUV lithography systems or projection exposure apparatuses are appropriate, that is to say, for example, laser plasma sources (LPP; Laser Produced Plasma) or else discharge sources (DPP; Discharge Produced Plasma).

A collector 4a indicated schematically in FIG. 1 can serve for acquiring and concentrating the illumination beam 4. Said collector can be an ellipsoidal mirror and/or a nested collector. Corresponding collectors are known from the prior art. A beam control apparatus 5 for the illumination beam 4 is disposed downstream of the light source 3 in the illumination beam path.

The beam control apparatus 5 includes a control component in the form of a control mirror 6 which influences the illumination beam path. The control mirror 6 is arranged downstream of the light source 3 in the beam path of the illumination beam 4. A reflection surface 7 (cf. FIG. 2) of the control mirror 6 is embodied in curved fashion. The reflection surface 7 can be ellipsoidally shaped. The reflection surface 7 can have different curvatures in mutually perpendicular sectional planes for correspondingly influencing the shape of a further course of the illumination beam 4.

Figure 2:
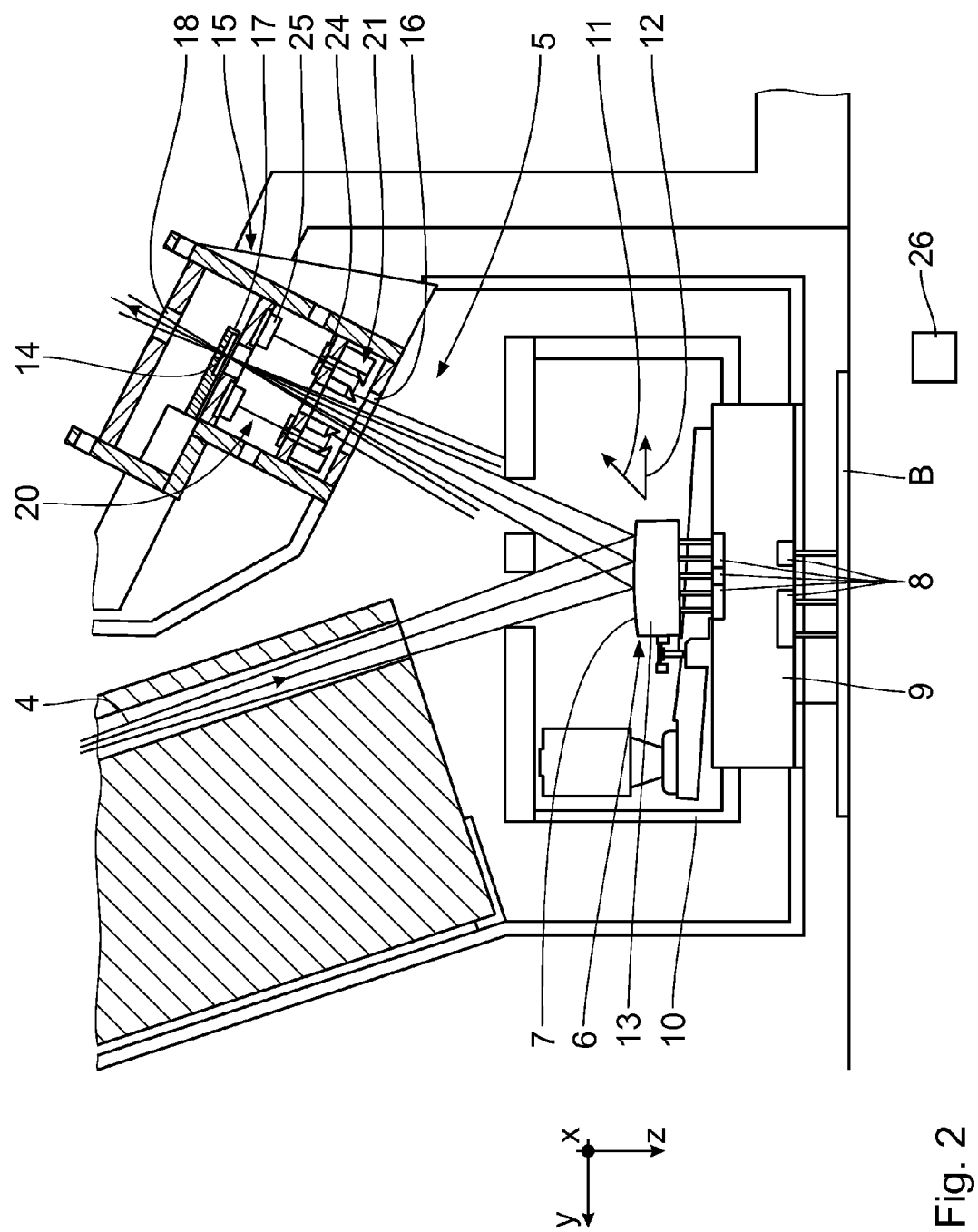
FIG. 2 shows, in an enlarged fashion and in a manner not true to scale in comparison with FIG. 1, an excerpt from the metrology system in the region of a control component of the beam control apparatus in the form of a control mirror.

The control mirror 6 is displaceable in a controlled manner in a plurality of degrees of freedom by means of a plurality of displacement actuators 8 illustrated schematically in FIG. 2. The displacement actuators 8 are supported by a mirror holder 9 for the control mirror 6. Operative connections between the displacement actuators 8 and the control mirror 6 are indicated schematically by solid lines in FIG. 2. The control mirror 6 is provided in a mirror chamber 10 with an entrance opening for the illumination beam 4 coming from the light source 3 and an exit opening for the illumination beam 4 reflected from the reflection surface 7. The control mirror 6 is tiltable about two mutually perpendicular tilting axes 11, 12 by two of the displacement actuators 8, which are embodied as tilting actuators that are drivable independently of one another.

In order to facilitate the description of positional relationships, a global xyz coordinate system is used hereinafter in connection with the description of FIGS. 1 and 2. The x-axis runs perpendicular to the plane of the drawing in FIGS. 1 and 2 and out of the latter. The y-axis runs toward the left in FIGS. 1 and 2. The z-axis runs down-ward in FIGS. 1 and 2.

The tilting axis 11 runs parallel to the x-axis. The tilting axis 12 runs parallel to the y-axis. The tilting actuators 8 make it possible to tilt the control mirror 6 about the tilting axes 11, 12 by +/−250 μrad. The tilting axes 11, 12 span a plane running parallel to a main body plane xy of a main body 13 of the control mirror, said main body bearing the reflection surface 7. The illumination beam 4 impinges on a point of intersection of the two tilting axes 11, 12, which are illustrated schematically beyond the control mirror 6 in FIG. 2. This ensures that tilting of the control mirror 6 leads to the smallest possible beam offset of the illumination beam 4. The tilting axes 11, 12 can also run differently depending on the embodiment of the tilting actuators.

Further displacement actuators 8 of the mirror holder 9 make a driven displacement of the mirror holder 9 possible relative to a base wall B of the system chamber of the metrology system 1. By means of one of the displacement actuators 8, it is possible for the mirror holder 9 to be displaced relative to the base wall B with a displacement distance of +/−5 mm in the z-direction.

By means of one of the displacement actuators 8, it is possible for the control mirror 6 to be displaced relative to the mirror holder 9 along a displacement distance of +/−400 μm in the z-direction.

The control mirror 6 is therefore embodied such that it is also displaceable along at least one degree of freedom of translation.

Together with the collector 4a, the control mirror 6 is part of a collector-focusing optical unit for acquiring the illumination emission of the light source 3 and for concentrating the acquired illumination beam 4 in an intermediate focus 14 disposed downstream of the control mirror 6. The control mirror 6 is therefore arranged upstream of the intermediate focus 14 in the illumination beam path.

Figure 3:
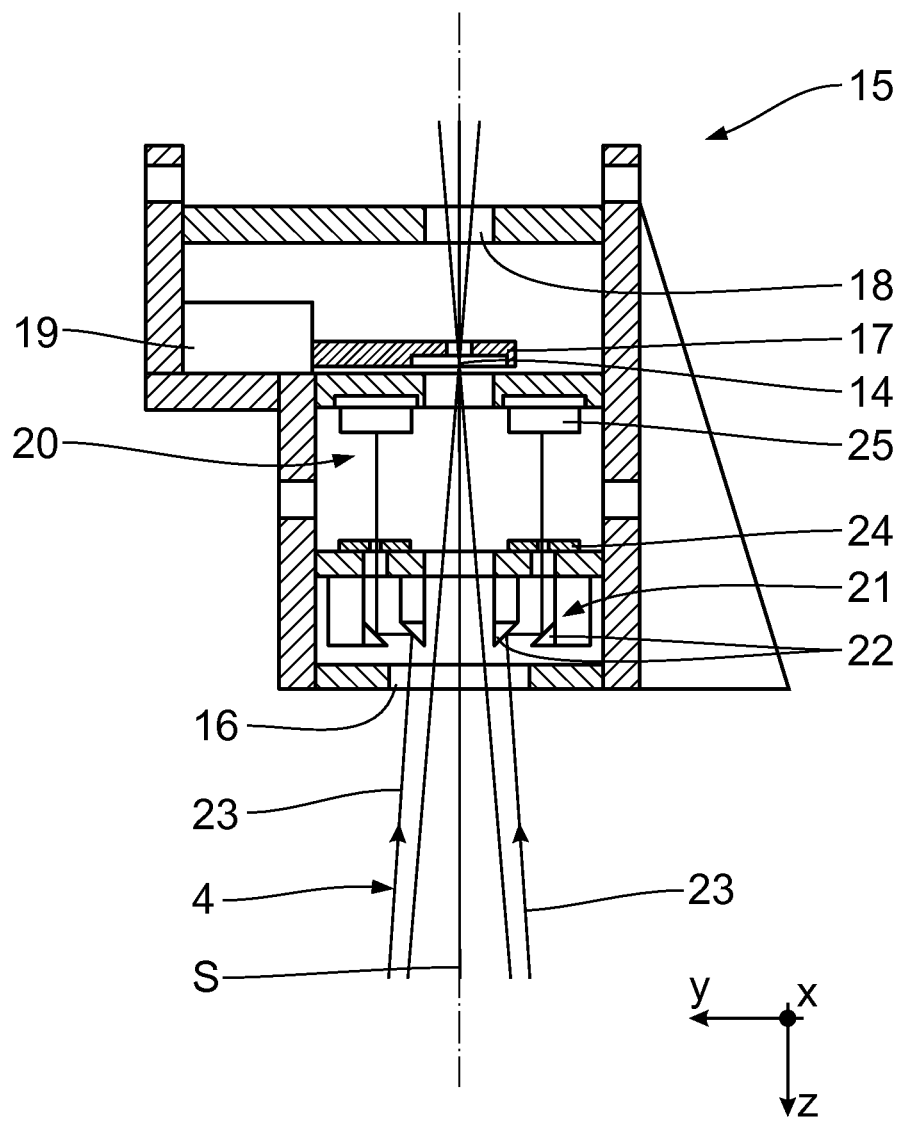
FIG. 3 shows, once again in an enlarged fashion, an excerpt from FIG. 2 in the region of an aerial image or intermediate focus module disposed downstream of the control mirror in the illumination beam path with a position sensor device for detecting a position of an aerial image or of an intermediate focus of the illumination beam.

An aerial image or intermediate focus module 15 of the beam control apparatus 5 is arranged in the region of an aerial image at the location of an intermediate focus 14, this module being illustrated in an enlarged manner in FIG. 3. The intermediate focus module 15 has an entrance opening 16 for the illumination beam 4, an intermediate focus diaphragm 17 at the location of the intermediate focus 14 and an exit opening 18 in the beam path of the illumination beam 4 downstream of the intermediate focus 14. The intermediate focus diaphragm 17 can be exchanged for another intermediate focus diaphragm by means of a driven changeable holder 19. This can be used for orientation and/or for size determination of the intermediate focus 14.

In order to facilitate the description of positional relationships within the intermediate focus module 15, a local xyz coordinate system is plotted in FIG. 3. The x-axis runs perpendicular to the plane of the drawing out of the latter. The y-axis runs toward the left in FIG. 3. The z-axis runs down-ward in FIG. 3 and parallel to a chief beam direction S of the illumination beam 4 through the intermediate focus module 15. The yz plane of the local xyz coordinate system corresponds to the yz plane of the global xyz coordinate system from FIGS. 1 and 2. The y-axis and the z-axis are in each case rotated by an angle of incidence of the illumination beam 4 on the control mirror 6 relative to the y-axis and the z-axis of the global xyz coordinate system in the clockwise direction about the x-axis. The x-axis of the global xyz coordinate system corresponds to the x-axis of the local xyz coordinate system, that is to say runs parallel thereto.

Part of the intermediate focus module 15 is a position sensor device 20 for detecting a spatial position of the intermediate focus 14. The position sensor device 20 includes a total of four coupling-out units 21 each having two coupling-out mirrors 22, of which two coupling-out units 21 are illustrated to the right and left of the passage of the illumination beam 4 in FIGS. 2 and 3.

The other two coupling-out units 21 surround the chief beam direction S at the level of the two illustrated coupling-out units 21 at a distance in the positive and negative x-direction, that is to say lie in front of and behind the plane of the drawing in FIG. 3. The total of four coupling-out units 21 arranged in a manner distributed in a circumferential direction around the chief beam direction S around the illumination beam 4 couple out marginal beam portions 23 of the illumination beam 4 which are not used for illuminating the object 2. The marginal beam portions 23 are guided via the coupling-out units 21 through coupling-out diaphragms 24 toward position sensors 25 of the intermediate focus module 15. The total of four position sensors 25, which are arranged in a manner distributed in a circumferential direction around the chief beam direction S of the illumination beam 4 like the coupling-out units 21, function in the manner of a quadrant detector. Alternatively, the position sensors of the intermediate focus module can be used as lateral effect photodiodes or delay-line detectors (DLD detectors).

Various embodiments are possible for the position sensors 25. In one embodiment, each of the position sensors 25 can determine a two-dimensional coordinate independently of the other position sensors. Alternatively, each of the position sensors 25 can exclusively determine a one-dimensional coordinate, such that two independent direction-measuring position sensors 25 are required in order to realize a two-dimensional measurement. In a further variant, a pair of opposite position sensors 25 that measure the beam portions 23 can determine a one-dimensional coordinate, such that two such pairs of position sensors 25 which determine one-dimensional coordinates independent of one another are used for two-dimensional position measurement. These variants described above can also be used in a redundant fashion in order that measurement errors are eliminated.

In an alternative embodiment of the beam control apparatus, not illustrated in the drawing, the at least one coupling-out unit 21 can be realized by structures on a mirror guiding the illumination beam, for example by structures on the control mirror 6. The structures can be formed for example by microstructures and/or by diffractive structures which couple out part of the illumination beam 4 for beam control.

A control device 26 illustrated schematically in FIG. 2 is signal-connected, in a manner not illustrated in specific detail, to the position sensors 25 of the position sensor device 20, on the one hand, and to the displacement actuators 8, on the other hand.

The control device 26 calculates control signals for the displacement actuators 8 from the sensor values that it receives from the position sensor device 20, and from the intermediate focus position signal resulting therefrom, and forwards said control signals to the displacement actuators 8 for the xy position control of the intermediate focus 14 by means of corresponding tilting of the control mirror 6. Therefore, a position of the intermediate focus is controlled with regard to the position thereof transversely with respect to a beam direction. In this case, the desired position can vary temporally. A temporal variation of this type is also designated as a wobble.

Arranged in the beam path of the illumination beam 4, for the intermediate focus module 15, there is a shutter unit 27 (illustrated schematically in FIG. 1) for the controlled interruption of illumination of the object 2, that is to say for the controlled blocking of the illumination beam 4. The shutter unit 27 can be an integral part of the metrology system 1. The shutter unit 27 is arranged downstream of the position sensor device 20 in the beam path of the illumination beam 4. This ensures position control uninfluenced by the shutter unit 27. An energy sensor device 28 illustrated schematically in FIG. 1 is disposed downstream of the shutter unit 27 in the beam path of the illumination beam 4. In principle, the energy sensor device 28 can be constructed with four coupling-out units and four energy sensors like the position sensor device 20. In one variant, both the position sensor device 20 and the energy sensor device 28 can also be realized with three coupling-out units and three sensors arranged in a star-shaped manner around a center through which the illumination beam 4 passes. The energy sensor device 28 can be used to measure the energy of the illumination beam 4 allowed through the intermediate focus diaphragm 17. This energy is all the higher, the better a z-position of the intermediate focus 14 corresponds to the z-position of the intermediate focus diaphragm 17. A z-position determination of the intermediate focus 14 is therefore possible by means of the energy sensor device 21. Said z-position determination is advantageous in the beam control apparatus 5, but is not a mandatory necessity. The energy sensor device 28 is also signal-connected to the control device 26 via a signal line (not illustrated). From the energy sensor device 28, the control device 26 receives a z-position signal for the intermediate focus 14. For the z-position determination, a z-oscillation can also be modulated onto the control mirror 6, said oscillation being detected, for example by the lock-in method, in a manner phase-correlated with the energy sensor device 28. A signed amplitude of the measurement result is then directly proportional to a defocusing of the intermediate focus 14, that is to say gives a measure of the z-position, which would be used for the z-position determination of the intermediate focus 14 and also for the z-position control by corresponding feedback driving of a z-position of the control mirror 6.

Disposed downstream of the energy sensor 28 is an imaging illumination optical unit assembly 29 for imaging the intermediate focus 14 onto an object field 30 to be illuminated in the object plane 2a, in which the structure to be illuminated of the object 2 is arranged. The illumination optical unit assembly 29 has two EUV mirrors 31 and 32.

The object field 30 is imaged into an image field 34 by means of an imaging optical unit in the form of a projection lens 33 comprising mirrors M1, M2 and M3. A measurement pick-up 35 in the form of a CCD image sensor, which detects the image field 34, is arranged at the location of the image field 34. Alternatively, the measurement pick-up 35 can be a CMOS camera or a fluorescent screen. The intermediate focus module 15, the shutter unit 27 and the energy sensor device 28 are arranged in an intermediate focus chamber 36. The illumination optical unit assembly 29 is arranged in an illumination optical unit chamber 37. The projection lens 33 is accommodated in a lens chamber 38, which for its part is subdivided into a plurality of partial chambers.

The beam control apparatus 5 and the projection lens 33 are part of an optical system of the metrology system 1. The position sensors 25 and the measurement pick-up 35 are configured such that they are sensitive to the beam portion 23 and the portions of the illumination beam 4 which contribute to the imaging of the object field 30.

Arranged between the energy sensor device 28 and the illumination optical unit assemblies 29 there is a stop or diaphragm unit 39 comprising a further stop or diaphragm 40 for the illumination beam 4. The diaphragm 40 is mounted in the intermediate focus chamber 36. The diaphragm 40 is arranged in a pupil plane of the illumination, such that, by selecting the portions of the illumination beam 4 which are allowed to pass through the diaphragm 40, it is possible to select the illumination angles at which the object field 2 is illuminated by means of the illumination beam 4.

The beam control apparatus 5 works as follows: the position sensor device 20 detects the xy position of the intermediate focus 14. Deviations of an actual position of the intermediate focus 14 from a predefined desired position are detected by the control device 26 by evaluation of the respective position signals and are converted into control signals for the displacement actuators 8, such that the actual position of the intermediate focus 14 is tracked to a predefined desired position. That subaperture of the illumination beam 4 which respectively illuminates the object field 30 is selected by means of the diaphragm unit 39. The control device 26 can be embodied such that a temporally variable desired position of the intermediate focus 14 is readjusted. Said temporally variable desired position can be predefined as a spiral path in which the desired position of the intermediate focus 14 moves in an intermediate focus plane with a segmentally increasing and decreasing radius. Accordingly the actual position of the intermediate focus 14 is tracked to said desired position. As an alternative or in addition to such spiral path tracking, wobble of the illumination beam 4 can be brought about by means of actuator-based tilting or displacement of the control component, that is to say of the control mirror 6 and/or of the support frame 41.

On account of the movement of the intermediate focus 14, the imaging of the intermediate focus 14 into the object field 2 results in a corresponding movement of that portion of the illumination beam 4 which is used for illuminating the object 2b. The object field 2 is therefore illuminated in accordance with the tracking of the intermediate focus 14 over the course of time with different portions of the entire available illumination beam 4. A homogenization of the illumination is obtained in this way, since local heterogeneities within the respectively used portions of the illumination beam 4 on the object 2b average out during the illumination thereof. The diaphragm 40 is used to predefine an illumination angle distribution during the illumination of the object field 2.

In the above-described embodiment of the metrology system 1 according to FIGS. 1 to 3, the control mirror 6 constitutes the control component of the beam control apparatus 5. Alternatively or additionally, the control component can also be formed by a displaceable support frame 41 for the light source 3. In this case, the support frame 41 of the light source 3 is mechanically connected to a displacement actuator 42, as indicated by dashed lines in FIG. 1. By means of the displacement actuator 42, a displacement of the light source 2 in at least two degrees of freedom of translation transversely with respect to the beam direction of the illumination beam 4 is possible. A displacement with more than two degrees of freedom can also be realized depending on the configuration of the displacement actuator 42 or a corresponding group of displacement actuators for the support frame 41. In this configuration, an xy position and preferably a z position of the intermediate focus 14 are realized by tracking the support frame 41 of the light source 3 with the displacement actuator 42. For this purpose, the at least one displacement actuator 42 is in turn signal-connected to the control device 26 and is driven in a manner corresponding to what has been explained above in connection with the displacement actuators 8.

During the use of the metrology system 1, the object 2 is illuminated within the object field 30 with the illumination beam 4, the beam guiding of which is controlled by means of the beam control apparatus 5. The structures of the object 2 which are situated in the object field 30 are imaged onto the measurement pick-up 35.

In an alternative or additional embodiment of the beam control apparatus 5, a relative difference in the beam intensity is measured, which is detected by opposite sensors of the energy sensor device 28. In this case, said opposite sensors detect coupled-out portions of the illumination beam 4 at opposite cross-sectional positions of the illumination beam 4. An actuating signal for a tilting of the EUV light source 3 by the displacement actuators 42 is derived from the measured intensity difference.

Instead of a tilting of the control mirror 6, the position of the intermediate focus 14 can also be readjusted by the control mirror 6 being displaced in its x-y position, that is to say being shifted laterally. This presupposes that the control mirror 6 is not embodied in planar fashion, but rather in curved fashion.

The position control described above can be used wherever an aerial image arises in the beam path of the illumination beam 4, that is to say in particular in the region of each focus of the illumination beam 4. The beam control apparatus 5 can also be used in arrangements in which the illumination beam is focused for the first time at the location of the object field 30. In this case, the aerial image in the object field 30 is used for position control, as already explained above in connection with the aerial image at the location of the intermediate focus 14.

A number of implementations have been described. Nevertheless, it will be understood that various modifications may be made. For example, elements of one or more implementations may be combined, deleted, modified, or supplemented to form further implementations. In addition, other components may be added to, or removed from, the described position measuring device. Accordingly, other implementations are within the scope of the following claims.

What is claimed:

1. A beam control apparatus for an illumination beam comprising
   at least one control component which influences a beam path of the illumination beam in the illumination beam path upstream of an aerial image of an object illuminated by the illumination beam, said component being displaceable in a controlled manner in at least one degree of freedom by at least one displacement actuator, the at least one control component being located in the illumination beam path upstream of the object,
   a position sensor device for detecting a position of the aerial image of the object, and
   a control device that is signal-connected to the position sensor device and the displacement actuator and calculates control signals for the displacement actuator from an aerial image position signal received from the position sensor device and forwards said control signals to the displacement actuator for controlling the position of the aerial image of the object,
   wherein the beam path of the illumination beam is directly influenced by the control component,
   wherein the control component is at least one of a component which is mechanically directly connected to a beam section or a component which is mechanically directly connected to at least one surface that guides the illumination beam path.

2. The beam control apparatus according to claim 1, wherein the control component comprises a control mirror that is tiltable about two tilting axes, which do not run co-linearly with respect to one another, by displacement actuators in the form of two tilting actuators that are drivable independently of one another.

3. The beam control apparatus according to claim 2, wherein the control mirror comprises a curved reflective surface.

4. The beam control apparatus according to claim 3, wherein the control mirror is further displaceable along at least one degree of freedom of translation by an actuator.

5. The beam control apparatus according to claim 2, wherein the control mirror is further displaceable along at least one degree of freedom of translation by an actuator.

6. The beam control apparatus according to claim 2, wherein the control device is configured such that a temporally variable desired position of the aerial image is readjusted.

7. The beam control apparatus according to claim 2, comprising a stop in the illumination beam path downstream of the control component.

8. The beam control apparatus according to claim 1, wherein the control component is formed by a displaceable support frame for the light source.

9. The beam control apparatus according to claim 8, wherein the control device is configured such that a temporally variable desired position of the aerial image is readjusted.

10. The beam control apparatus according to claim 8, comprising a stop in the illumination beam path downstream of the control component.

11. The beam control apparatus according to claim 1, wherein the position sensor device comprises at least one coupling-out unit that directs a part of the illumination beam onto a position sensor of the position sensor device.

12. The beam control apparatus according to claim 11, wherein the control device is configured such that a temporally variable desired position of the aerial image is readjusted.

13. The beam control apparatus according to claim 11, comprising a stop in the illumination beam path downstream of the control component.

14. The beam control apparatus according to claim 11, wherein the position sensor device comprises at least two coupling-out mirrors and at least two position sensors, wherein the coupling-out mirrors each direct a part of the illumination beam onto the respective position sensor.

15. The beam control apparatus according to claim 14, wherein the control device is configured such that a temporally variable desired position of the aerial image is readjusted.

16. The beam control apparatus according to claim 1, comprising a stop in the illumination beam path downstream of the control component.

17. The beam control apparatus according to claim 16, wherein the control device is configured such that a temporally variable desired position of the aerial image is readjusted.

18. The beam control apparatus according to claim 1, wherein the control device is configured such that a temporally variable desired position of the aerial image is readjusted.

19. An optical system comprising:
a beam control apparatus according to claim 1, and
an imaging optical unit for imaging an object field, which is illuminated with the illumination beam and is disposed downstream of the aerial image, into an image field.

20. A metrology system for examining objects, the metrology system comprising:
an optical system according to claim 19,
a light source for generating the illumination beam, and
a measurement pick-up that detects the image field.

21. The beam control apparatus of claim 1 in which the control component comprises at least one of a source unit of the illumination beam or a control mirror.

22. The beam control apparatus of claim 1 in which the position sensor device detects a positional deviation of the aerial image transversely with respect to a predefined beam direction.

23. A beam control apparatus for an illumination beam comprising:
at least one control component which influences a beam path of the illumination beam in the illumination beam path upstream of an aerial image of the illumination beam, said component being displaceable in a controlled manner in at least one degree of freedom by at least one displacement actuator,
a position sensor device for detecting a position of the aerial image along an intermediate focus plane, and
a control device that is signal-connected to the position sensor device and the displacement actuator and calculates control signals for the displacement actuator from an aerial image position signal received from the position sensor device and forwards said control signals to the displacement actuator for controlling the position of the aerial image, such that the displacement actuator is controlled to adjust the position of the aerial image along the intermediate focus plane based on feedback from the position sensor device.

\* \* \* \* \*